United States Patent
Shen (10) Patent No.: US 9,743,025 B2
(45) Date of Patent: Aug. 22, 2017

(54) METHOD AND SYSTEM OF IMPLEMENTING AN UNEVEN TIMING GAP BETWEEN EACH IMAGE CAPTURE IN AN IMAGE SENSOR

(71) Applicant: OMNIVISION TECHNOLOGIES, INC., Santa Clara, CA (US)

(72) Inventor: Jie Shen, Fremont, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 17 days.

(21) Appl. No.: 14/985,116

(22) Filed: Dec. 30, 2015

(65) Prior Publication Data

US 2017/0195604 A1 Jul. 6, 2017

(51) Int. Cl.
*H04N 5/376* (2011.01)
*H04N 5/378* (2011.01)
(Continued)

(52) U.S. Cl.
CPC ......... *H04N 5/3765* (2013.01); *H04N 5/2253* (2013.01); *H04N 5/2254* (2013.01);
(Continued)

(58) Field of Classification Search
CPC .. H04N 5/3765; H04N 5/2253; H04N 5/2254; H04N 5/378; H04N 5/2353;
(Continued)

(56) References Cited

U.S. PATENT DOCUMENTS 8,237,813 B2 * 8/2012 Garten ............... G09G 5/06
348/229.1
8,279,328 B2 * 10/2012 Lahav ............... H04N 5/335
348/222.1

(Continued)

FOREIGN PATENT DOCUMENTS

WO WO 2016/030301 A1 3/2016
WO WO 2016/073527 A1 5/2016

OTHER PUBLICATIONS

U.S. Appl. No. 14/791,018, Non-Final Office Action dated Aug. 26, 2016, (18 pages).

(Continued)

*Primary Examiner* — Michael Osinski
(74) *Attorney, Agent, or Firm* — Christensen O'Connor Johnson Kindness PLLC (57) ABSTRACT

Stacked chip imaging system comprising pixel array partitioned into pixel sub-arrays (PSAs) disposed in first semiconductor die and ADC circuitry including ADC circuits disposed in second semiconductor die. Each PSA is arranged into pixel groups. Each pixel group generates pixel data signals. Pixel array captures image data of first frame with first exposure time, second frame with second exposure time, third frame with third exposure time, and fourth frame with fourth exposure time. First, second, third and fourth exposure times are different. At least one of the pixel groups in each of the pixel sub-arrays is coupled to a different ADC circuit from pixels groups remaining in each of the pixel sub-arrays. ADC circuitry acquires the pixel data signals.

(Continued)

For each frame, ADC circuits converts pixel data signal received from pixel groups respectively coupled thereto from analog to digital to generate ADC outputs. Other embodiments are also described.

25 Claims, 7 Drawing Sheets (51) Int. Cl.
H04N 5/225 (2006.01)
H04N 5/235 (2006.01)
H04N 5/355 (2011.01)

(52) U.S. Cl.
CPC ......... *H04N 5/35581* (2013.01); *H04N 5/378* (2013.01); *H04N 5/2353* (2013.01); *H04N 5/2355* (2013.01)

(58) Field of Classification Search
CPC ........... H04N 5/23245; H04N 5/35563; H04N 5/2355; H04N 5/3742; H04N 5/355; H04N 5/35554; H04N 5/35581; H04N 5/35572
See application file for complete search history.

(56) References Cited

U.S. PATENT DOCUMENTS

| 9,172,889 | B2* | 10/2015 | Li | H04N 5/2353 |
| 9,521,348 | B2* | 12/2016 | Shen | H04N 5/374 |
| 9,654,699 | B2* | 5/2017 | Shen | H04N 5/2353 |
| 2006/0192867 | A1* | 8/2006 | Yosefin | H04N 5/3535 348/273 |
| 2007/0076109 | A1* | 4/2007 | Krymski | H04N 5/32 348/300 |
| 2008/0158398 | A1* | 7/2008 | Yaffe | H04N 5/35581 348/294 |
| 2008/0258042 | A1* | 10/2008 | Krymski | H04N 3/155 250/208.1 |
| 2010/0103194 | A1 | 4/2010 | Chen et al. | |
| 2010/0309333 | A1* | 12/2010 | Smith | H04N 5/235 348/230.1 |
| 2011/0216228 | A1* | 9/2011 | Kawamura | H04N 5/335 348/273 |
| 2012/0188392 | A1 | 7/2012 | Smith | |
| 2012/0218426 | A1 | 8/2012 | Kaizu et al. | |
| 2012/0287294 | A1* | 11/2012 | Kaizu | H04N 5/2355 348/208.4 |
| 2013/0038767 | A1* | 2/2013 | Kawamura | H01L 27/14601 348/294 |
| 2013/0057754 | A1 | 3/2013 | Shimada et al. | |
| 2013/0076937 | A1 | 3/2013 | Tajima et al. | |
| 2014/0022401 | A1* | 1/2014 | Awatani | H04N 5/335 348/207.11 |
| 2014/0267828 | A1* | 9/2014 | Kasai | H04N 9/045 348/229.1 |
| 2015/0189187 | A1 | 7/2015 | Youn et al. | |
| 2015/0237282 | A1* | 8/2015 | Shimada | H04N 5/23258 348/297 |
| 2015/0296158 | A1 | 10/2015 | Mansoorian et al. | |
| 2015/0350555 | A1* | 12/2015 | Nishi | H04N 5/23293 348/333.02 |
| 2016/0330392 | A1* | 11/2016 | Solhusvik | H04N 5/37457 |
| 2017/0006207 | A1* | 1/2017 | Shen | H04N 5/2353 |

OTHER PUBLICATIONS

U.S. Appl. No. 14/696,120, filed Apr. 24, 2015, Jie Shen et al.
U.S. Appl. No. 14/791,018, filed Jul. 2, 2015, Jie Shen.
ROC (Taiwan) Pat. App. No. 105116497—Notice of Allowance and Translated Search Report, dated Dec. 30, 2016, 4 pages.
U.S. Appl. No. 14/791,018—Notice of Allowance, dated Jan. 9, 2017, 13 pages.

* cited by examiner

METHOD AND SYSTEM OF IMPLEMENTING AN UNEVEN TIMING GAP BETWEEN EACH IMAGE CAPTURE IN AN IMAGE SENSOR

FIELD

An example of the present invention relates generally to image sensors. More specifically, examples of the present invention are related to methods and systems to implement an uneven timing gap between each image capture in an image sensor.

BACKGROUND

High speed image sensors have been widely used in many applications in different fields including the automotive field, the machine vision field, and the field of professional video photography. The technology used to manufacture image sensors, and in particular, complementary-metal-oxide-semiconductor (CMOS) image sensors, has continued to advance at great pace. For example, the demand of higher frame rates and lower power consumption has encouraged the further miniaturization and integration of these image sensors.

In addition to the frame rate and power consumption demands, image sensors are also subjected to performance demands. The quality and accuracy of the pixel readouts cannot be compromised to accommodate the increase in frame rate or power consumption.

One way to increase the frame rate of a CMOS image sensor may be to increase the number of readout circuits operating in parallel. However, in current image sensors, the minimum time interval in between two successive image captures is about 4 milliseconds (ms). Given that the short exposure is much less than 4 milliseconds (e.g., 1 ms), the timing gap between this short exposure and the subsequent image capture is 3 milliseconds. Similarly, the ultra-short exposure is about 0.25 ms such that the timing gap between this ultra-short exposure and the subsequent image capture is 3.75 milliseconds. The ratio between successive exposure times is 4:1. Accordingly, the current image sensors readout quality suffers due to this large timing gap between successive image captures which degrades image quality (e.g., ghost issues).

BRIEF DESCRIPTION OF THE DRAWINGS

The embodiments of the invention are illustrated by way of example and not by way of limitation in the figures of the accompanying drawings in which like references indicate similar elements throughout the various views unless otherwise specified. It should be noted that references to "an" or "one" embodiment of the invention in this disclosure are not necessarily to the same embodiment, and they mean at least one. In the drawings.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth in order to provide a thorough understanding of the present invention. However, it is understood that embodiments of the invention may be practiced without these specific details. In other instances, well-known circuits, structures, and techniques have not been shown to avoid obscuring the understanding of this description.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. Particular features, structures or characteristics may be included in an integrated circuit, an electronic circuit, a combinatorial logic circuit, or other suitable components that provide the described functionality.

Figure 3:
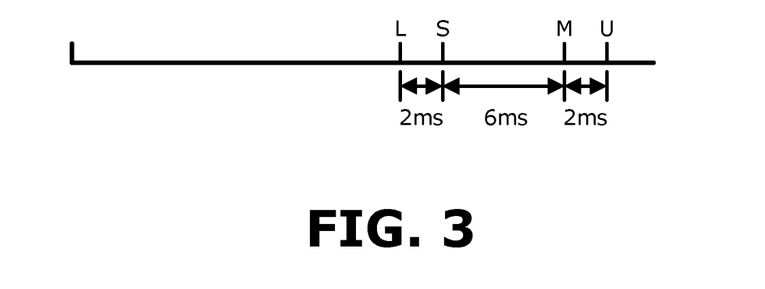
FIG. 3 is a timing diagram illustrating the uneven timing gap between each image capture implemented by the image system of FIG. 1 in accordance to one embodiment of the invention.

As will be disclosed in various examples, an effective method of improving the image quality of an image sensor is to decrease the time interval between two successive captures. Since high dynamic range (HDR) frames have uneven exposure time, in one embodiment, uneven time intervals is implemented between each capture in an image sensor to improve the image quality (e.g., reduce ghost effect). In current image sensors, the time intervals between subsequent captures are equal (e.g., 4 ms). In these image sensors, the first frame is captured with a long (L) exposure time, a second frame with a medium (M) exposure time, a third frame with a short (S) exposure time, and a fourth frame with an ultra-short (U) exposure time. As shown in the timing diagram in FIG. 3, in one embodiment of the invention, the timing gap between each image capture by the image sensor is uneven. As shown in FIG. 3, image sensor captures a first frame with a long (L) exposure time, a second frame with a short (S) exposure time, a third frame with a medium (M) exposure time, and a fourth frame with a ultra-short (U) exposure time. In this sequence, the time interval may be uneven between captures. For instance, both the time interval between the first frame capture with a long (L) exposure time and the second frame capture with a short (S) exposure time and the time interval between the third frame capture with a medium (M) exposure time and the fourth frame capture with an ultra-short (U) exposure time may be 2 ms. Further, the time interval between the second frame capture with a short (S) exposure time and the third frame capture with a medium (M) exposure time may be 6 ms. The time intervals may be, for example, 2 ms, 6 ms, or greater. In some embodiments, the time interval may not be between 2 ms and 6 ms.

Figure 1:
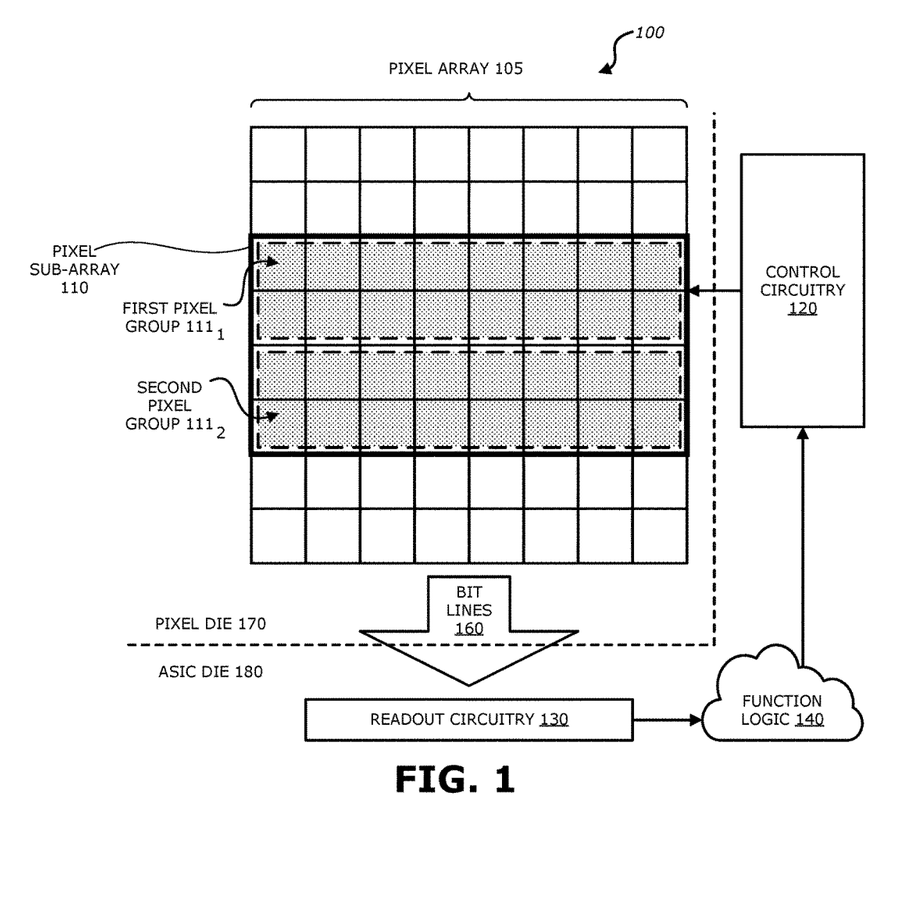
FIG. 1 is a block diagram illustrating an example imaging system that implements an uneven timing gap between each image capture in accordance to one embodiment of the invention.

FIG. 1 is a block diagram illustrating an example imaging system that implements an uneven timing gap between each image capture in accordance with one embodiment of the invention. As illustrated in FIG. 1, imaging system 100 includes an image sensor having a pixel array 105 partitioned into a plurality of pixel sub-arrays including a pixel architecture for high dynamic range (HDR) in a stacked image sensor scheme in accordance with the teachings of the present invention. In the illustrated example, imaging system 100 is realized with stacked CMOS chips, which include a pixel die 170 stacked with and coupled to an ASIC die 180. For instance, in one example, pixel die 170 includes a pixel array 105, and ASIC die 180 includes control circuitry 120, readout circuitry 130, and function logic 140. In the depicted example, control circuitry 120 is coupled to control operation of pixel array 105, which is coupled to be read out by readout circuitry 130 through bit lines 160.

In particular, in the example depicted in FIG. 1, pixel array 105 is a two-dimensional (2D) array that is partitioned into a plurality of pixel sub-arrays 110 as shown. In one example, each pixel sub-array 110 includes a plurality of pixel groups (e.g., $111_1$, $111_2$), each of which includes a plurality of pixel cells (not shown in FIG. 1). In the example, pixel cells in each one of the plurality of pixel groups (e.g., $111_1$, $111_2$) in a pixel sub-array 110 is coupled to utilize the same bit line of bit lines 160. In one example, bit line 160 may couple all of the pixel cells in each one of the plurality of pixel groups (e.g., $111_1$, $111_2$) to an ADC circuit in readout circuitry 130, which may be formed on an ASIC die 280 that is stacked with and coupled to pixel die 270. In one embodiment, at least one of the pixel groups (e.g., $111_1$, $111_2$) in each of the pixel sub-arrays is coupled to a different analog-to-digital converter (ADC) circuit in readout circuitry 130 from the pixels groups remaining in each of the pixel sub-arrays 110, more details of which will be described below.

In one example, an interconnect layer (not shown) is disposed between the pixel die 170 and ASIC die 280. In one example, interconnect layer may include a plurality of conductors. In example, each one of the plurality of conductors may be utilized to couple readout circuitry 130 to circuitry included in pixel die 170.

For instance, bit line 160 may be realized using one of the plurality of conductors that are included in interconnect layer. In other words, in one example, each single one of the plurality of pixel groups (e.g., $111_1$, $111_2$) in each pixel sub-arrays 110 in pixel die 270 may be coupled to a corresponding single one of a plurality of readout circuits (e.g., readout circuit) included in readout circuitry 130 in ASIC die 180 through a corresponding single one of the plurality of conductors (e.g., bit line 160) included in interconnect layer. As such, in one example, each single one of pixel groups (e.g., $111_1$, $111_2$) in pixel sub-array 110 may be read out in parallel by a corresponding single one of the plurality of readout circuits through a corresponding single one of the plurality of conductors, or single bit line, in accordance with the teachings of the present invention. In one example, the interconnect layer may include vias such as micro-through silicon vias ($\mu$TSVs) or through silicon vias (TSVs).

In the example depicted in FIG. 1, pixel sub-array 110 includes a plurality of pixel groups (e.g., $111_1$, $111_2$) that arranged into n=8 columns and m=4 rows. Each of the two pixel groups (e.g., $111_1$, $111_2$) that make up pixel sub-array 110 in the example depicted in FIG. 1 includes pixel cells arranged into p=8 columns and q=2 rows. In some embodiments, a pixel support circuitry (not shown) is that is shared by all pixel cells of each pixel group (e.g., $111_1$, $111_2$), respectively. In one embodiment, each one of the pixel sub-arrays 110 is arranged into a plurality of n×m array of pixel cells, and each one of the pixel groups (e.g., $111_1$, $111_2$) is arranged into a p×q array of pixel cells. In one embodiment, at least one of n, m, p, and q is an integer greater than 1.

Control circuitry 120 is coupled to pixel array 105 to control the operational characteristics of pixel array 105. In one example, control circuitry 120 is coupled to generate a global shutter signal for controlling image acquisition for each pixel cell. In the example, the global shutter signal simultaneously enables particular pixel cells within all pixel sub-arrays 110 of pixel array 105 to simultaneously transfer the image charge from their respective photodetector during a single acquisition window.

In one embodiment, the control circuitry 120 controls the pixel array to cause the pixel array 105 to capture image data of a first frame with a first exposure time, a second frame with a second exposure time, a third frame with a third exposure time, and a fourth frame with a fourth exposure time. The first, second, third and fourth exposure times may be different. For example, the first exposure time may be a long (L) exposure time, the second exposure time may be a short (S) exposure time, the third exposure time may be a medium (M) exposure time, and the fourth exposure time may be an ultra-short (U) exposure time. In this example, the ultra-short (U) exposure time is shorter than the short (S) exposure time which is shorter than the medium (M) exposure time which is shorter than the long (L) exposure time. An object captured by a pixel array image data with these four exposure times may be combined using function logic 140 to output a resultant image with a high dynamic range.

Accordingly, in one embodiment, timing gaps between capturing the first and second frames, the second and third frames, and third and fourth frames are uneven. In one embodiment, an automatic exposure control logic is included in function logic 140 and determines a ratio of the first exposure time to the second exposure time. The automatic exposure control logic thus calculates the appropriate exposure values (e.g., the first, second, third, and forth exposure times) which are transmitted to the control circuitry 120 to implement the exposure values during capture and readout of the pixel array 105. Control circuitry 120 may also include selection circuitry (e.g., multiplexers), etc. to readout a row of image data at a time along readout bit lines 160 or may readout the image data using a variety of other techniques, such as a serial readout or a full parallel readout of all pixels simultaneously. In one embodiment, readout circuitry 130 reads out image data from pixel array 105.

In one example, after each of the pixel cells in a pixel sub-array 110 has acquired or captured its image data or image charge, the image data is read out by readout circuitry 130 through a bit line of bit lines 160. Each pixel cell (or pixel group) generates pixel data signals which are readout by readout circuitry 130. In one embodiment, a logic circuitry (not shown) can control readout circuitry 130 and output image data to function logic 140. Function logic 140 may simply store the image data or even manipulate the image data by applying post image effects (e.g. crop, rotate, remove red eye, adjust brightness, adjust contrast, or otherwise).

Figure 2:
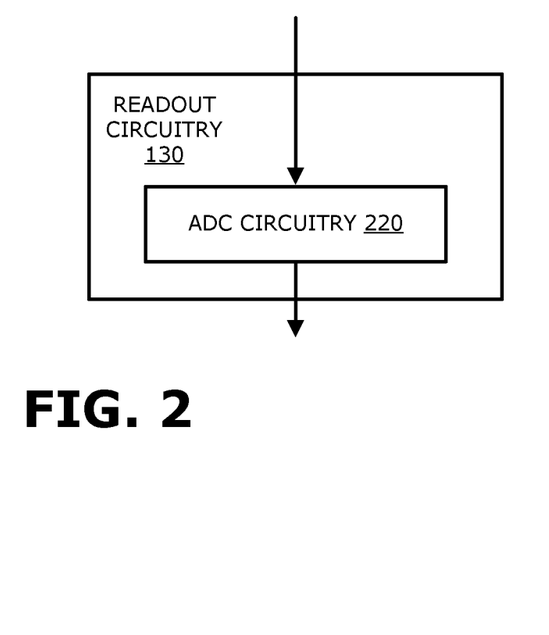
FIG. 2 is a block diagram illustrating the details of readout circuitry in FIG. 1 in accordance to one embodiment of the invention.

FIG. 2 is a block diagram illustrating the details of readout circuitry 130 in FIG. 1 in accordance to one embodiment of the invention. In one embodiment, readout circuitry 130 includes a plurality of readout circuits. As shown in FIG. 2, readout circuitry 130 may include an analog-to-digital converter (ADC) circuitry 220 and amplification circuitry (not shown). ADC circuitry 220 may receive the pixel signal from pixel array 105 and convert the pixel signal from analog to digital. For example, ADC circuitry 220 included in readout circuits, respectively, may convert the pixel signal of an image frame from analog to digital to obtain an ADC output. In one example, each of the plurality of readout circuits in readout circuitry 130 may also include adders that are formed on ASIC die 180, with memory such as SRAM and DRAM formed on a memory die, which may be coupled to ASIC die 280 through an interconnect layer.

Figure 4A:
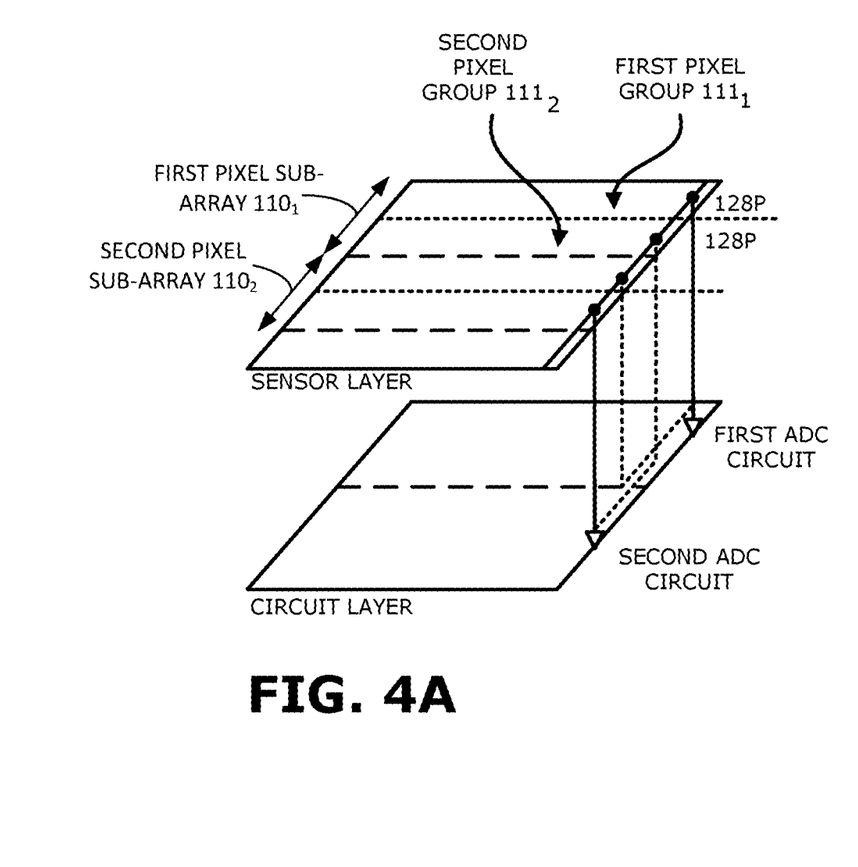
FIG. 4A illustrates the details of imaging system in FIG. 1 including an example pixel array included on a pixel chip and an example readout circuitry included on a circuit chip coupled thereto according to a first embodiment of the invention and FIG. 4B illustrates the details of the coupling between pixel groups in pixel array and ADC circuits in readout circuitry according to the first embodiment of the invention.
Figure 4B:
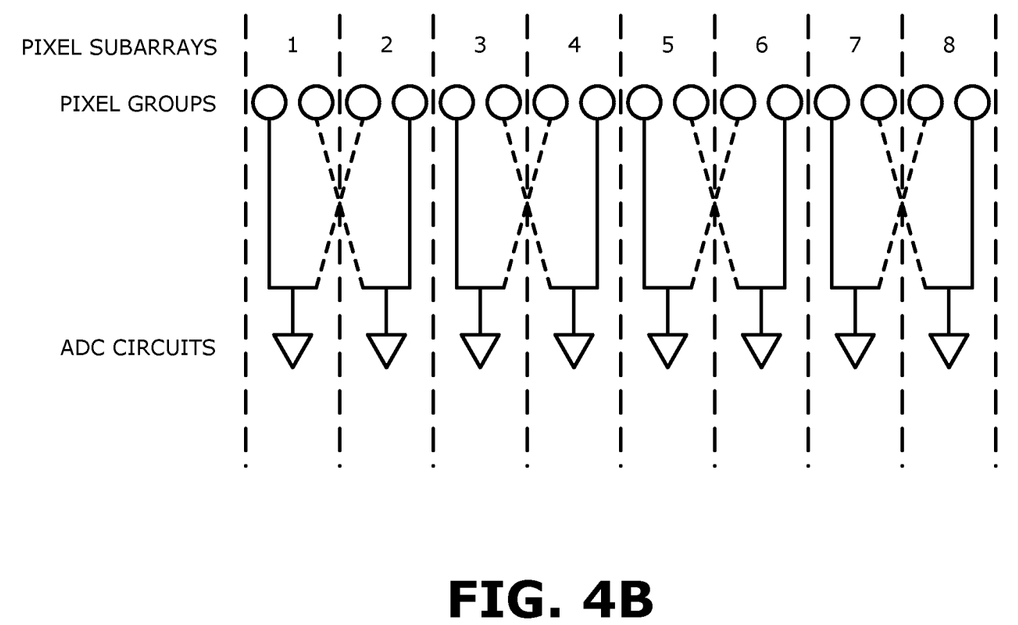

FIG. 4A illustrates the details of imaging system 100 in FIG. 1 including an example pixel array 105 included on a pixel chip (or die) 270 and an example readout circuitry 130 included on a circuit chip (e.g. ASIC die 280) coupled thereto according to a first embodiment of the invention and FIG. 4B illustrates the details of the coupling between pixel groups (e.g., $111_1$, $111_2$) in pixel array 105 and ADC circuits (e.g., first and second ADC circuits) in readout circuitry 130 according to the first embodiment of the invention. As shown in FIGS. 4A-4B, each pixel sub-array 110 is a pixel row of 256 pixels, and the plurality of pixel groups (e.g., $111_1$, $111_2$) in each pixel sub-array 110 includes a first pixel group (e.g., $111_1$) of 128 pixels and a second pixel group (e.g., $111_2$) of 128 pixels. As illustrated in FIG. 4A, the first and second pixel groups (e.g., $111_1$, $111_2$) are separate. Referring to FIG. 4B, first pixel group $111_1$ of first pixel sub-array $110_1$ is coupled to a first ADC circuit, whereas second pixel group $111_2$ of first pixel sub-array $110_1$ is coupled to a second ADC circuit. In second pixel sub-array, first pixel group $111_1$ of second pixel sub-array $110_2$ is coupled to first ADC circuit and second pixel group $111_2$ of second pixel sub-array $110_2$ is coupled to second ADC circuit.

In one embodiment, imaging system 100 may be a stacked chip that performs multi-frame high dynamic range (HDR). In this embodiment, imaging system 100 performs HDR by using a frame buffer to store multiple image captures. In one example, Dynamic Random Access Memory (DRAM) address management is used in imaging system 100. In this embodiment, one or multiple ADC segments to be enabled sequentially and different ADC segments to have different exposure time.

In one example, first pixel sub-array $110_1$ and second pixel sub-array $110_2$ may have different exposure times, for example, first pixel sub-array $110_1$ has a first exposure time which may be long (L) exposure time, while second pixel sub-array $110_2$ has a second exposure time which may be short (S) exposure time during a first frame. While during a second frame, first pixel sub-array $110_1$ may have a third exposure time which may be a medium (M) exposure time and second pixel sub-array $110_2$ has a fourth exposure time which may be an ultra-short (U) exposure time. In this way, function logic 140 may output a resultant image with HDR using two frames instead of four.

In another example, sequential pixel sub-array 110 may have different exposure times, for example, a first pixel sub-array $110_1$ has a first exposure time which may be long (L) exposure time, a second pixel sub-array $110_2$ has a second exposure time which may be short (S), a third and fourth pixel sub-array (not shown) has a third and fourth exposure time which may be medium (M) and ultra-short (U) exposure time respectively. In this way, function logic 140 may output a resultant image with HDR using one frame.

In another example, sequential pixel sub-array 110 may have different exposure times, for example, a first pixel sub-array $110_1$ and third pixel sub-array $110_3$ have a first exposure time which may be long (L) exposure time, and a second pixel sub-array $110_2$ and a fourth pixel sub-array $110_4$ have a second exposure time which may be short (S) exposure time during. In this way, function logic 140 may output a resultant image with HDR using one frame. In this interleaved exposure scheme, a pseudo-rolling shutter may be used.

Figure 5A:
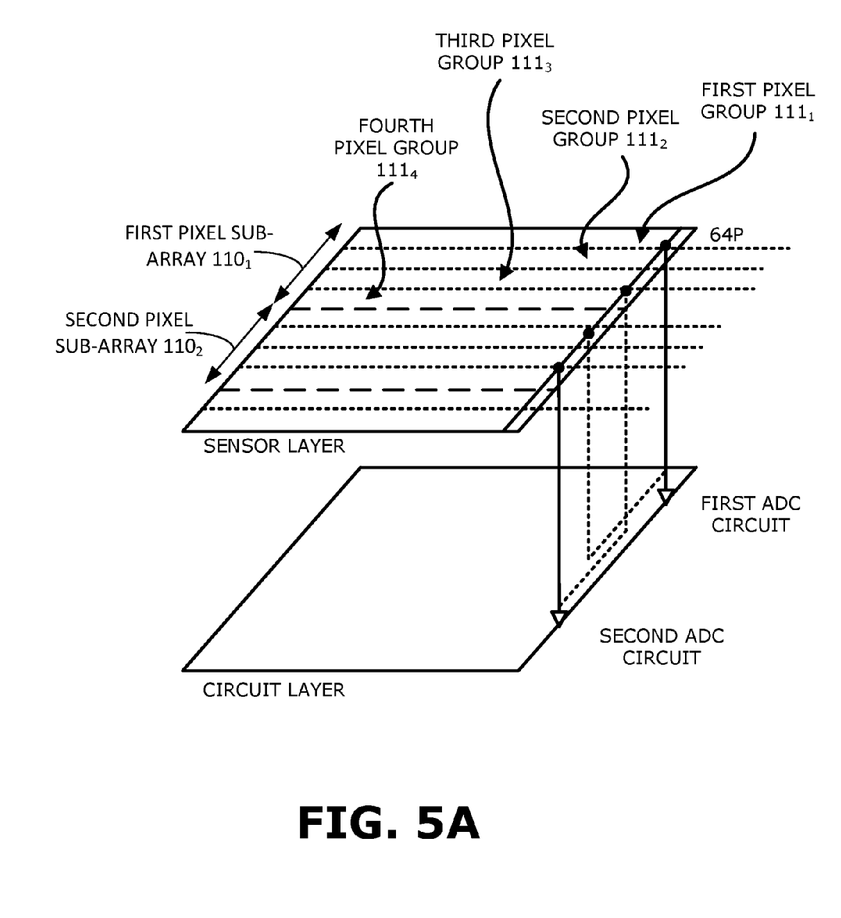
FIG. 5A illustrates the details of imaging system in FIG. 1 including an example pixel array included on a pixel chip and an example readout circuitry included on a circuit chip coupled thereto according to a second embodiment of the invention and FIG. 5B illustrates the details of the coupling between pixel groups in pixel array and ADC circuits in readout circuitry according to the second embodiment of the invention.
Figure 5B:
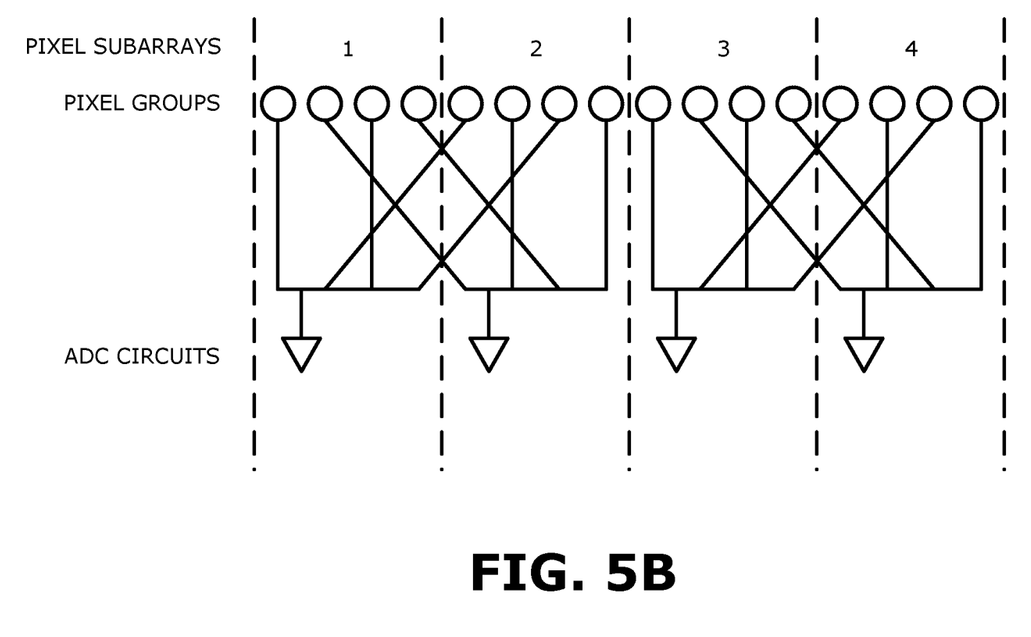

FIG. 5A illustrates the details of imaging system in FIG. 1 including an example pixel array 105 included on a pixel chip (or die) 170 and an example readout circuitry 130 included on a circuit chip (e.g. ASIC die 180) coupled thereto according to a second embodiment of the invention and FIG. 5B illustrates the details of the coupling between pixel groups (e.g., $111_1$, $111_2$, $111_3$, $111_4$) in pixel array 105 and ADC circuits (e.g., first and second ADC circuits) in readout circuitry 130 according to the second embodiment of the invention. As shown in FIGS. 5A-5B, each pixel sub-array 110 (e.g. $110_1$ and $110_2$) is a pixel row of 256 pixels, and the plurality of pixel groups in each pixel sub-array includes four pixel groups (e.g., $111_1$, $111_2$, $111_3$, $111_4$) in each pixel sub-array 110. Each of the four pixel groups includes 64 pixels in this embodiment of the invention. As illustrated in FIG. 5A, the four pixel groups (e.g., $111_1$, $111_2$, $111_3$, $111_4$) are separate. Referring to FIG. 5B, first pixel group $111_1$ and third pixel group $111_3$ of first pixel sub-array $110_1$ is coupled to a first ADC circuit, whereas second pixel group $111_2$ and fourth pixel group $111_4$ of first pixel sub-array $110_1$ is coupled to a second ADC circuit. Thus, in this embodiment, at least one of the pixel groups (e.g., $111_2$, $111_4$) in each of the pixel sub-arrays is coupled to a different ADC circuit from the pixels groups remaining (e.g., $111_1$, $111_3$) in each of the pixel sub-arrays 110. Similarly, in second pixel sub-array $110_2$, first pixel group $111_1$ and third pixel group $111_3$ of second pixel sub-array $110_2$ is coupled to a first ADC circuit, whereas second pixel group $111_2$ and fourth pixel group $111_4$ of second pixel sub-array $110_2$ is coupled to a second ADC circuit.

In one example, first pixel sub-array $110_1$ and second pixel sub-array $110_2$ may have different exposure times, for example, first pixel sub-array $110_1$ has a first exposure time which may be long (L) exposure time, while second pixel sub-array $110_2$ has a second exposure time which may be short (S) exposure time during a first frame. While during a second frame, first pixel sub-array $110_1$ may have a third exposure time which may be a medium (M) exposure time and second pixel sub-array $110_2$ has a fourth exposure time which may be an ultra-short (U) exposure time. In this way, function logic 140 may output a resultant image with HDR using two frames instead of four.

In another example, sequential pixel sub-array 110 may have different exposure times, for example, a first pixel sub-array $110_1$ has a first exposure time which may be long (L) exposure time, a second pixel sub-array $110_2$ has a second exposure time which may be short (S), a third and fourth pixel sub-array (not shown) has a third and fourth exposure time which may be medium (M) and ultra-short (U) exposure time respectively. In this way, function logic 140 may output a resultant image with HDR using one frame.

In another example, sequential pixel sub-array 110 may have different exposure times, for example, a first pixel sub-array $110_1$ and third pixel sub-array $110_3$ have a first exposure time which may be long (L) exposure time, and a second pixel sub-array $110_2$ and a fourth pixel sub-array $110_4$ have a second exposure time which may be short (S) exposure time during. In this way, function logic 140 may output a resultant image with HDR using one frame. In this interleaved exposure scheme, a pseudo-rolling shutter may be used.

Moreover, the following embodiments of the invention may be described as a process, which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a procedure, etc.

Figure 6:
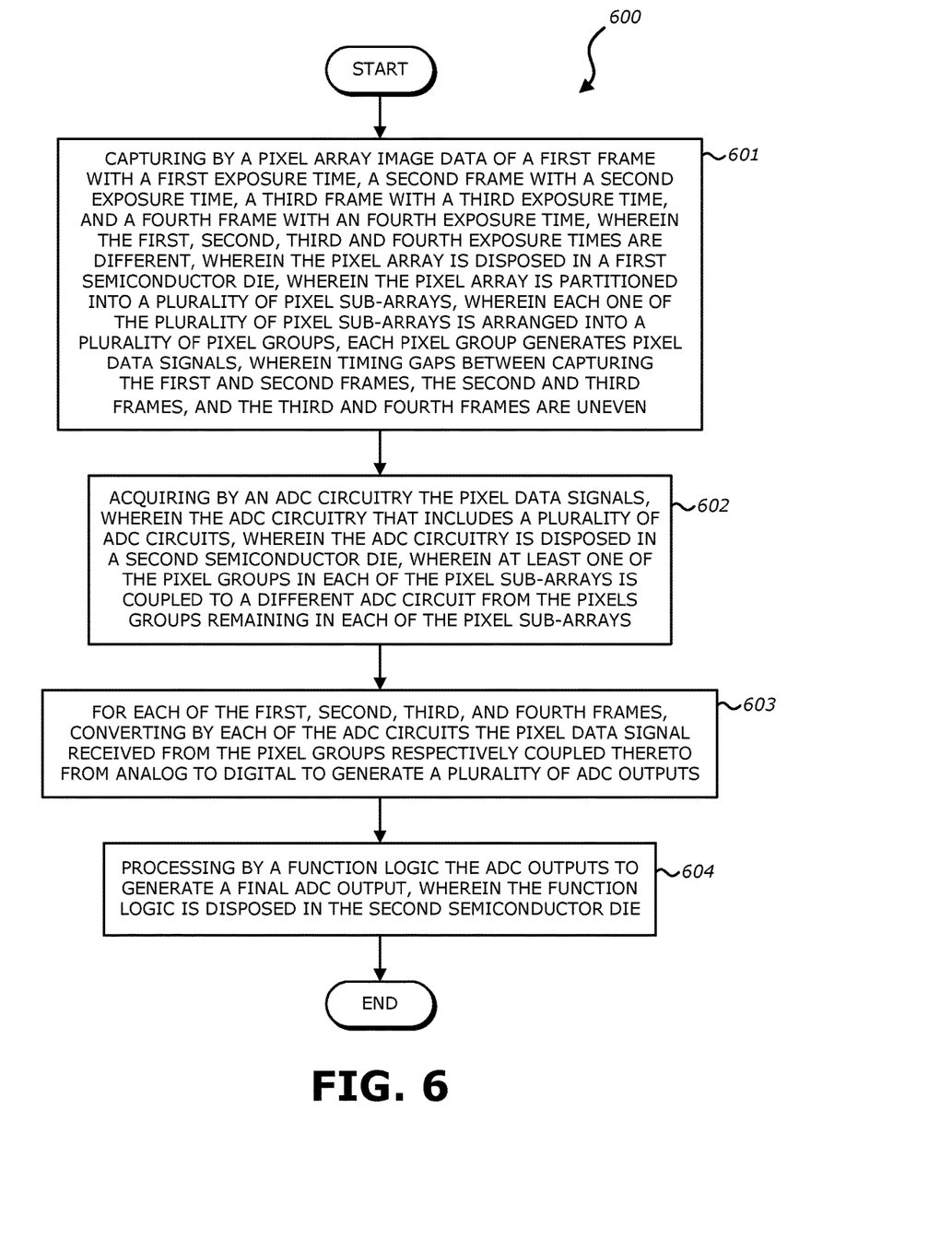
FIG. 6 is a flow chart showing an example process of implementing an uneven timing gap between each image capture in an imaging system in accordance to one embodiment of the invention.

FIG. 6 is a flow chart showing an example process of implementing an uneven timing gap between each image capture in an imaging system in accordance to one embodiment of the invention. Method 600 starts with a pixel array 105 capturing image data of a first frame with a first exposure time, a second frame with a second exposure time, a third frame with a third exposure time, and a fourth frame with a fourth exposure time (Block 601). In one embodiment, the first, second, third, and fourth frames are sequential. In one embodiment, the first, second, third and fourth exposure times may be different from one another. In one embodiment, timing gaps between capturing the first and second frames, the second and third frames, and third and fourth frames are uneven. As illustrated in the embodiment in FIG. 3, the first exposure time may be a long (L) exposure time, the second exposure time may be a short (S) exposure time, the third exposure time may be a medium (M) exposure time, and the fourth exposure time may be an ultra-short (U) exposure time. The ultra-short (U) exposure time is shorter than the short (S) exposure time. The short (S) exposure time is shorter than the medium (M) exposure time. The medium (M) exposure time is shorter than the long (L) exposure time. Pixel array 105 may be disposed in a first semiconductor die 170. Pixel array 105 may be partitioned into a plurality of pixel sub-arrays 110. Each one of the plurality of pixel sub-arrays 110 is arranged into a plurality of pixel groups (e.g., $111_1$, $111_2$). Each pixel group (e.g., $111_1$, $111_2$) generates pixel data signals. At Block 602, an ADC circuitry 220 acquires the pixel data signals. ADC circuitry 220 that includes a plurality of ADC circuits. ADC circuitry 220 may be disposed in a second semiconductor die 180. In one embodiment, at least one pixel group (e.g., $111_1$) of pixel groups (e.g., $111_1$, $111_2$) in each of the pixel sub-arrays 110 is coupled to a different ADC circuit from pixels groups (e.g., $111_2$) remaining in each of the pixel sub-arrays. At Block 603, for each of the first, second, third, and fourth frames, each of the ADC circuits converts the pixel data signal received from pixel groups (e.g., $111_1$, $111_2$) respectively coupled thereto from analog to digital to generate a plurality of ADC outputs. At Block 604, a function logic 140 processes the ADC outputs to generate a final ADC output. In some embodiments, function logic 140 is disposed in the second semiconductor die 180.

The processes explained above are described in terms of computer software and hardware. The techniques described may constitute machine-executable instructions embodied within a machine (e.g., computer) readable storage medium, that when executed by a machine will cause the machine to perform the operations described. Additionally, the processes may be embodied within hardware, such as an application specific integrated circuit ("ASIC") or the like.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. A method of implementing an uneven timing gap between each image capture in an image sensor comprising:
    capturing by a pixel array image data of a first frame with a first exposure time, a second frame with a second exposure time, a third frame with a third exposure time, and a fourth frame with an fourth exposure time, wherein the first, second, third and fourth exposure times are different, wherein timing gaps between capturing the first and second frames, the second and third frames, and third and fourth frames are uneven,
    wherein the pixel array is disposed in a first semiconductor die, wherein the pixel array is partitioned into a plurality of pixel sub-arrays, wherein each one of the plurality of pixel sub-arrays is arranged into a plurality of pixel groups, each pixel group generates pixel data signals;
    acquiring by an analog-to-digital conversion (ADC) circuitry the pixel data signals, wherein the ADC circuitry that includes a plurality of ADC circuits, wherein the ADC circuitry is disposed in a second semiconductor die, wherein at least one of the pixel groups in each of the pixel sub-arrays is coupled to a different ADC circuit from the pixels groups remaining in each of the pixel sub-arrays; and
    for each of the first, second, third, and fourth frames, converting by each of the ADC circuits the pixel data signal received from the pixel groups respectively coupled thereto from analog to digital to generate a plurality of ADC outputs.

2. The method of claim 1, further comprising:
processing in the second semiconductor die, the ADC outputs to generate a final ADC output.

3. The method of claim 1, wherein ADC circuitry is included in a readout circuitry that is disposed in the second semiconductor die.

4. The method of claim 1, wherein the pixel groups are coupled to different ADC circuits through a corresponding one of a plurality of conductors.

5. The method of claim 1, wherein the first exposure time is a long exposure time, the second exposure time is a short exposure time, the third exposure time is a medium exposure time, and the fourth exposure time is an ultra-short exposure time, wherein the ultra-short exposure time is shorter than the short exposure time which is shorter than the medium exposure time which is shorter than the long exposure time.

6. The method of claim 1, wherein each pixel sub-array is a pixel row of 256 pixels, and the plurality of pixel groups in each pixel sub-array includes a first pixel group of 128 pixels and a second pixel group of 128 pixels, wherein the first and second pixel groups are separate.

7. The method of claim 1, wherein each pixel sub-array is a pixel row of 256 pixels, and the plurality of pixel groups in each pixel sub-array includes four pixel groups, each of the four pixel groups include 64 pixels, wherein the four pixel groups are separate.

8. The method of claim 1, wherein each one of the plurality of pixel sub-arrays is arranged into a plurality of n×m array of pixel cells, and each one of the plurality of pixel groups is arranged into a p×q array of pixel cells, wherein each one of n, m, p, and q is a positive integer.

9. The method of claim 8, wherein each one of n, m, p, and q is a positive integer greater than 1.

10. A stacked chip imaging system comprising:
a pixel array disposed in a first semiconductor die, wherein the pixel array is partitioned into a plurality of pixel sub-arrays, wherein each one of the plurality of pixel sub-arrays is arranged into a plurality of pixel groups, each pixel group generates pixel data signals, wherein the pixel array captures image data of a first frame with a first exposure time, a second frame with a second exposure time, a third frame with a third exposure time, and a fourth frame with an fourth exposure time, wherein the first, second, third and fourth exposure times are different, wherein timing gaps between capturing the first and second frames, the second and third frames, and third and fourth frames are uneven; and
an analog-to-digital conversion (ADC) circuitry that includes a plurality of ADC circuits, the ADC circuitry is disposed in a second semiconductor die, wherein at least one of the pixel groups in each of the pixel sub-arrays is coupled to a different ADC circuit from the pixels groups remaining in each of the pixel sub-arrays, wherein the ADC circuitry acquires the pixel data signals, wherein for each of the first, second, third, and fourth frames, each of the ADC circuits converts the pixel data signal received from the pixel groups respectively coupled thereto from analog to digital to generate a plurality of ADC outputs.

11. The imaging system in claim 10, further comprising:
processing in the second semiconductor die the ADC outputs to generate a final ADC output.

12. The imaging system in claim 10, wherein ADC circuitry is included in a readout circuitry that is disposed in the second semiconductor die.

13. The imaging system in claim 10, further comprising:
a plurality of conductors to couple the pixel groups to ADC circuits, respectively.

14. The imaging system in claim 10, wherein the first exposure time is a long exposure time, the second exposure time is a short exposure time, the third exposure time is a medium exposure time, and the fourth exposure time is an ultra-short exposure time, wherein the ultra-short exposure time is shorter than the short exposure time which is shorter than the medium exposure time which is shorter than the long exposure time.

15. The imaging system in claim 10, wherein each pixel sub-array is a pixel row of 256 pixels, and the plurality of pixel groups in each pixel sub-array includes a first pixel group of 128 pixels and a second pixel group of 128 pixels, wherein the first and second pixel groups are separate.

16. The imaging system in claim 10, wherein each pixel sub-array is a pixel row of 256 pixels, and the plurality of pixel groups in each pixel sub-array includes four pixel groups, each of the four pixel groups include 64 pixels, wherein the four pixel groups are separate.

17. The imaging system in claim 10, wherein each one of the plurality of pixel sub-arrays is arranged into a plurality of n×m array of pixel cells, and each one of the plurality of pixel groups is arranged into a p×q array of pixel cells, each one of n, m, p, and q is a positive integer.

18. The imaging system in claim 17, wherein each one of n, m, p, and q is a positive integer greater than 1.

19. A stacked chip imaging system comprising:
a pixel array disposed in a first semiconductor die, wherein the pixel array is partitioned into a plurality of pixel sub-arrays including a first pixel sub-array and a second pixel sub-array, wherein each one of the plurality of pixel sub-arrays is arranged into a first pixel group that generates a first pixel data signal and a second pixel group that generates a second pixel data signal, wherein each of the pixel sub-arrays is a pixel row and each of the pixel groups is half of the pixel row,
wherein when the pixel array captures image data of a first frame, the first pixel sub-array captures image data with a first exposure time and the second pixel sub-array captures image data with a second exposure time,
wherein when the pixel array captures image data of a second frame, the first pixel sub-array captures image data with a third exposure time and the second pixel sub-array captures image data with a fourth exposure time, wherein the first, the second, the third, and the fourth exposure times are different; and
an analog-to-digital conversion (ADC) circuitry that includes a plurality of ADC circuits included in a readout circuitry to acquire the first and second pixel data signals for each of the first and the second frames, the ADC circuitry is disposed in a second semiconductor die, wherein the ADC circuits include a first and a second ADC circuit, wherein the first and the second ADC circuits are different,
wherein the first pixel groups in the first pixel sub-array and the second pixel sub-arrays are coupled to the first ADC circuit and the second pixel groups in the first pixel sub-array and the second pixel sub-array are coupled to the second ADC circuit,
wherein for each of the first and the second frames, the first and second ADC circuits convert the first and second pixel data signals from analog to digital to obtain a first and second ADC output, respectively.

20. The imaging system in claim 19, wherein each pixel sub-array is a pixel row of 256 pixels, and the first and the second pixel groups are 128 pixels, respectively, and wherein the first and the second pixel groups are separate.

21. A stacked chip imaging system comprising:
a pixel array disposed in a first semiconductor die, wherein the pixel array is partitioned into a plurality of pixel sub-arrays, wherein each one of the plurality of pixel sub-arrays is arranged into a plurality of pixel groups, each pixel group generates pixel data signals, wherein a first pixel sub-array captures a first image data of a first frame with a first exposure time, a second pixel sub-array captures a second image data of the first frame with a second exposure time, a third pixel sub-array captures a third image data of the first frame with a third exposure time, and a fourth pixel sub-array captures a fourth image data of the first frame with a fourth exposure time, wherein the first and second exposure times are different, and the third and fourth exposure times are different, wherein timing gaps between capturing the first and the second image data of the first frame, the second and the third image data of the first frame, and the third and the fourth image data of the first frame are uneven; and
an analog-to-digital conversion (ADC) circuitry that includes a plurality of ADC circuits, the ADC circuitry is disposed in a second semiconductor die, wherein at least one of the pixel groups in each of the pixel sub-arrays is coupled to a different ADC circuit from the pixels groups remaining in each of the pixel sub-arrays, wherein the ADC circuitry acquires the pixel data signals, wherein each of the ADC circuits converts the pixel data signal received from the pixel groups respectively coupled thereto from analog to digital to generate a plurality of ADC outputs.

22. The imaging system of claim 21, wherein the first, second, third, and fourth exposure times are different, wherein the first exposure time is a long exposure time, the second exposure time is a short exposure time, the third exposure time is a medium exposure time, and the fourth exposure time is an ultra-short exposure time, wherein the ultra-short exposure time is shorter than the short exposure time which is shorter than the medium exposure time which is shorter than the long exposure time.

23. The imaging system of claim 21, wherein the first and third exposure times are the equal, and the second and fourth exposure times are equal, wherein the first and third exposure time are a long exposure time, and the second and fourth exposure time are a short exposure time, wherein the short exposure time which is shorter than the long exposure time.

24. A stacked chip imaging system comprising:
a pixel array disposed in a first semiconductor die, wherein the pixel array is partitioned into a plurality of pixel sub-arrays, wherein each one of the plurality of pixel sub-arrays is arranged into a plurality of pixel groups, each pixel group generates pixel data signals, wherein a first pixel sub-array captures a first image data of a first frame with a first exposure time, and a second pixel sub-array captures a second image data of the first frame with a second exposure time, wherein the first pixel sub-array captures a third image data of a second frame with a third exposure time, and the second pixel sub-array captures a fourth image data of the second frame with a fourth exposure time, wherein the first and second exposure times are different, and the third and fourth exposure times are different, wherein timing gaps between capturing the first and the second image data of the first frame, the second image data of the first frame and the first image data of the second frame, and the third image data of the second frame and the fourth image data of the second frame are uneven; and
an analog-to-digital conversion (ADC) circuitry that includes a plurality of ADC circuits, the ADC circuitry is disposed in a second semiconductor die, wherein at least one of the pixel groups in each of the pixel sub-arrays is coupled to a different ADC circuit from the pixels groups remaining in each of the pixel sub-arrays, wherein the ADC circuitry acquires the pixel data signals, wherein each of the ADC circuits converts the pixel data signal received from the pixel groups respectively coupled thereto from analog to digital to generate a plurality of ADC outputs.

25. The imaging system of claim 24, wherein the first, second, third, and fourth exposure times are different, wherein the first exposure time is a long exposure time, the second exposure time is a short exposure time, the third exposure time is a medium exposure time, and the fourth exposure time is an ultra-short exposure time, wherein the ultra-short exposure time is shorter than the short exposure time which is shorter than the medium exposure time which is shorter than the long exposure time.

* * * * *